United States Patent
Gdala et al.

(10) Patent No.: US 10,777,729 B2
(45) Date of Patent: Sep. 15, 2020

(54) ELECTRONIC DEVICE AND CONTROL METHOD THEREOF

(71) Applicant: Samsung Electronics Co., Ltd., Suwon-si, Gyeonggi-do (KR)

(72) Inventors: Tomasz Robert Gdala, Plewiska (PL); Bartosz Pawel Skorupski, Poznan (PL); Maciej Wladyslaw Jagiełło, Zagaje (PL)

(73) Assignee: Samsung Electronics Co., Ltd., Suwon-si (KR)

( * ) Notice: Subject to any disclaimer, the term of this patent is extended or adjusted under 35 U.S.C. 154(b) by 529 days.

(21) Appl. No.: 15/388,866

(22) Filed: Dec. 22, 2016

(65) Prior Publication Data
US 2017/0200881 A1 Jul. 13, 2017

(30) Foreign Application Priority Data
Jan. 8, 2016 (KR) .................. 10-2016-0002765

(51) Int. Cl.
| | |
|---|---|
| *H01L 41/09* | (2006.01) |
| *G06F 3/01* | (2006.01) |
| *G06F 3/044* | (2006.01) |

(52) U.S. Cl.
CPC .............. *H01L 41/09* (2013.01); *G06F 3/016* (2013.01); *G06F 3/044* (2013.01); *G06F 2203/04102* (2013.01); *G06F 2203/04108* (2013.01)

(58) Field of Classification Search
CPC combination set(s) only.
See application file for complete search history.

(56) References Cited

U.S. PATENT DOCUMENTS

| | | | |
|---|---|---|---|
| 2004/0056877 A1* | 3/2004 | Nakajima | G06F 3/0488 715/702 |
| 2009/0272206 A1* | 11/2009 | Stumpf | G01D 18/00 73/866.5 |
| 2010/0039412 A1 | 2/2010 | Kim et al. | |

(Continued)

FOREIGN PATENT DOCUMENTS

| | | |
|---|---|---|
| EP | 2 933 709 A2 | 10/2015 |
| KR | 10-0901381 B1 | 6/2009 |
| KR | 10-2010-0021189 A | 2/2010 |

OTHER PUBLICATIONS

Ju, Woo-Eon, et al., "A flexible tactile-feedback touch screen 10using transparent ferroelectric polymer film vibrators", School of Mechanical Engineering, Jun. 17, 2014, pp. 1-10, XP 055496210, Nam-gu, Ulsan, Korea.

(Continued)

*Primary Examiner* — Bryan P Gordon
(74) *Attorney, Agent, or Firm* — Jefferson IP Law, LLP

(57) ABSTRACT

An electronic device and control method thereof are provided. The electronic device includes a first layer disposed on a surface of the electronic device and configured to be touched or gripped by a user and to generate a signal corresponding to a touch or grip area of the user, a second layer disposed on the first layer and configured to have a surface of the second layer deformed, and a processor configured to detect a user's touch or grip based on the generated signal, and control the second layer to deform a surface of the second layer to have a protrusion pattern on the touch or grip area of the second layer based on the generated signal.

20 Claims, 14 Drawing Sheets

(56) References Cited

U.S. PATENT DOCUMENTS

| | | | |
|---|---|---|---|
| 2011/0109588 A1* | 5/2011 | Makinen | G09B 21/003 |
| | | | 345/174 |
| 2011/0169742 A1 | 7/2011 | Lipton et al. | |
| 2012/0086651 A1 | 4/2012 | Kwon et al. | |
| 2012/0274599 A1* | 11/2012 | Schediwy | G06F 3/044 |
| | | | 345/174 |
| 2015/0122621 A1* | 5/2015 | Fukumoto | H03K 17/9622 |
| | | | 200/5 A |
| 2015/0248164 A1 | 9/2015 | Ciesla et al. | |

OTHER PUBLICATIONS

European Examination Report dated Apr. 20, 2020, issued in European Application No. 17 736 117.7-1216.

* cited by examiner

FIG. 3A
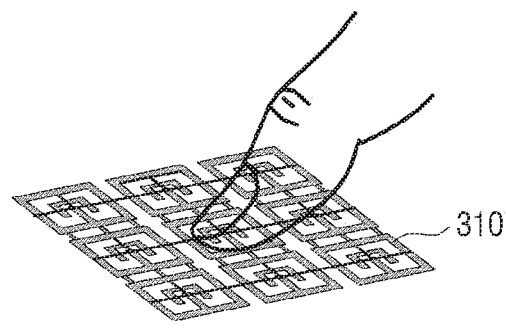
FIG. 3B
$$\begin{bmatrix} 0 & 0 & 0 & 0 & 0 & 0 & 0 \\ 0.1 & 0.3 & 0.6 & 0.4 & 0.1 & 0.4 & 0.1 \\ 0.5 & 0.8 & 0.8 & 0.9 & 0.8 & 0.8 & 0.5 \\ 0.6 & 0.9 & 1 & 1 & 1 & 0.9 & 0.6 \\ 0.5 & 0.8 & 1 & 1 & 1 & 0.9 & 0.5 \\ 0.6 & 0.9 & 1 & 1 & 1 & 0.8 & 0.6 \\ 0.5 & 0.8 & 0.8 & 0.9 & 0.8 & 0.8 & 0.5 \\ 0.2 & 0.3 & 0.1 & 0.3 & 0.6 & 0.4 & 0.1 \\ 0 & 0 & 0 & 0 & 0 & 0 & 0 \\ 0 & 0 & 0 & 0 & 0 & 0 & 0 \end{bmatrix}$$
320
FIG. 3C
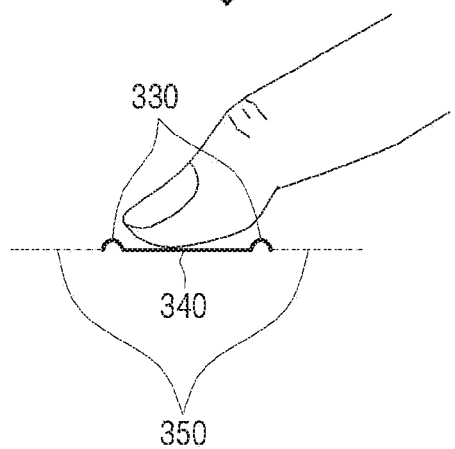

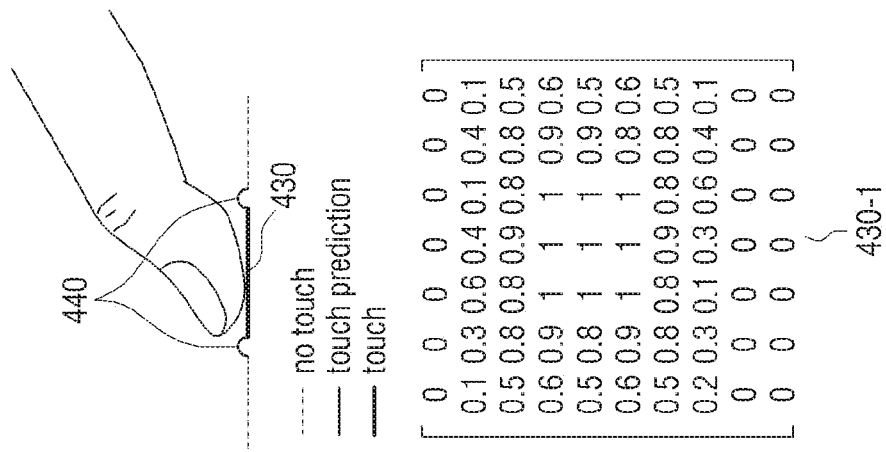
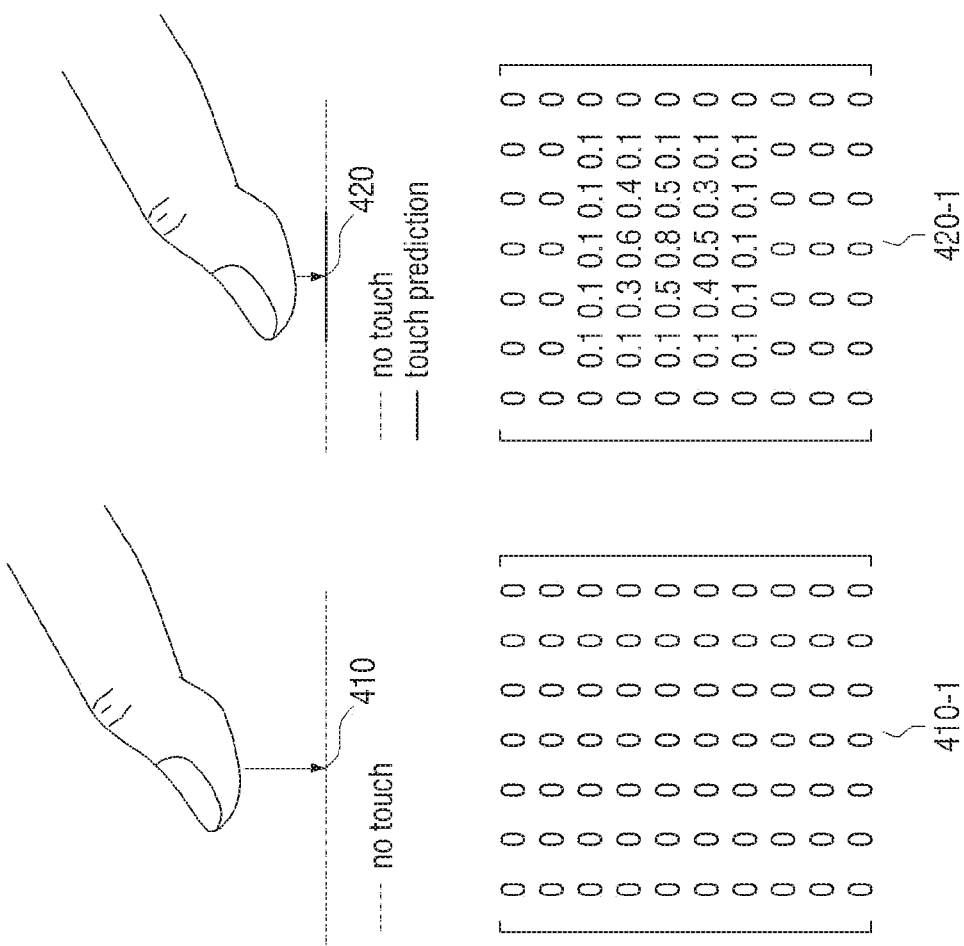

ELECTRONIC DEVICE AND CONTROL METHOD THEREOF

CROSS-REFERENCE TO RELATED APPLICATION(S)

This application claims the benefit under 35 U.S.C. § 119(a) of a Korean patent application filed on Jan. 8, 2016 in the Korean Intellectual Property Office and assigned Serial number 10-2016-0002765, the entire disclosure of which is hereby incorporated by reference.

TECHNICAL FIELD

The present disclosure relates to an electronic device which enhances a grip including a sense of touch of a user on the device through shape deformation on the surface of the device on a touch and/or grip area, and a method thereof.

BACKGROUND

Technology for providing a variety of sense of touch through a touch panel using a tactile sensor has been developing in recent years.

In general, the tactile sensor provides vibration, softness, unevenness, and smoothness to users in addition to friction on a capacitive touch screen through an actuator using electrostatic power. However, the related-art capacitive touch technology has a problem that it is limited to specific fields such as a touch screen and a touch panel.

To solve this problem, tactile sensor technology using a conductive polymer having flexibility and elasticity like human skin is developing in recent years.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an electronic device which provides an optimum touch and/or grip to a user through shape deformation on the surface of the device on a touch and/or grip area using a deformable electroactive polymer (EAP) on the surface of the device, and a method thereof.

In accordance with aspect of the present disclosure, an electronic device is provided. The electronic device includes a first layer disposed on a surface of the electronic device and configured to be touched or gripped by a user and to generate a signal corresponding to a touch or grip area of the user, a second layer disposed on the first layer and configured to have a surface of the second layer deformed, and a processor configured to detect a user's touch based on the generated signal, and control the second layer to deform a surface of the touch or grip area of the second layer to have a protrusion pattern based on the generated signal.

The processor may be configured to control the second layer to deform a surface of the touch or grip area of the second layer to have a first protrusion pattern using at least one of a bump, a dot, and a line for increasing a handling friction coefficient of the user within the touch or grip area of the second layer.

The processor may be configured to control the second layer to deform a surface of the touch or grip area of the second layer to have a second protrusion pattern using at least one of a bump, a dot, and a line for enhancing stability of handling of the user on an area surrounding the touch or grip area of the second layer.

In response to the protrusion pattern having directional orientation, the processor may be configured to control the second layer to change the protrusion pattern to a surface having a protrusion pattern which is perpendicular to a gravity direction on the touch or grip area.

The processor may be configured to control the second layer to deform a surface of the touch or grip area of the second layer to have a protrusion pattern of different height according to at least one of gravity force, acceleration, and detected tension on the touch or grip area of the second layer.

In response to the protrusion pattern having an orientation, the processor may be further configured to control the second layer to change the protrusion pattern with the orientation determined according to at least one of a detected rotation, a detected tilt, and a detected motion of the electronic device.

The processor may be configured to control a type of the protrusion pattern to be variable according to user setting, and control the second layer to deform the surface of the second layer to have the protrusion pattern on an entire area or the touch or grip area of the second layer.

In response to the first layer being a capacitive layer, the processor may be configured to generate a touch matrix having different values according to gravity force of the first layer from a user's skin in response to the signal in the user's grip, touch, or hovering area of the first layer.

In response to the user gripping or touching the first layer, the processor may be configured to control the second layer to deform a surface of the second layer to have a protrusion pattern corresponding to the generated touch matrix value.

In response to the user performing hovering over the first layer, the processor may be configured to predict a predetermined protrusion pattern corresponding to the generated touch matrix value, and control the second layer to change a surface of the second layer to have the protrusion pattern.

The protrusion pattern may be a protrusion pattern using at least one of a character, a text, and a picture.

The second layer may be an EAP.

In accordance with another aspect of the present disclosure, a method for changing a shape of a grip surface of an electronic device is provided. The method includes generating a signal corresponding to a user's touch or grip area in a first layer which is disposed on a surface of the electronic device and configured to be touched or gripped by the user, receiving, by a second layer disposed on a surface of the first layer and configured to have a surface of the second layer deformed, the signal, detecting the user's touch or grip based on the generated signal, and deforming the touch or grip area of the second layer to a surface having a protrusion pattern based on the received signal.

The deforming may include deforming the touch or grip area of the second layer to a surface having a first protrusion pattern using at least one of a bump, a dot, and a line for increasing a handling friction coefficient of the user within the touch or grip area of the second layer.

The deforming may include deforming the touch or grip area of the second layer to a surface having a second protrusion pattern using at least one of a bump, a dot, and a line for enhancing stability of handling of the user on an area surrounding the touch or grip area of the second layer.

The deforming may include, in response to the protrusion pattern having orientation, deforming the protrusion pattern to a surface having a protrusion pattern which is perpendicular to a gravity direction on the touch or grip area of the second layer.

The deforming may include deforming the touch or grip area of the second layer to a surface having a protrusion pattern of different height according to at least one of gravity force, acceleration, and detected tension on the touch or grip area of the second layer.

The deforming may include controlling a type of the protrusion pattern to be variable according to user setting, and changing to the surface having the protrusion pattern on an entire area or the touch or grip area of the second layer.

The method may further include, in response to the first layer being a capacitive layer, generating a touch matrix having different values according to gravity force of the first layer from user's skin in response to the signal in a user's grip, touch, or hovering area of the first layer.

The method may further include, in response to the user gripping or touching the first layer, changing the second layer to a surface having a protrusion pattern corresponding to the generated touch matrix value.

The method may further include, in response to the user performing hovering over the first layer, predicting, by the second layer, a predetermined protrusion pattern corresponding to the generated touch matrix value, and changing a surface of the second layer to have the protrusion pattern.

As described above, the various embodiments provide an apparatus and method for providing an optimum grip to a user using various sensors such as a touch sensor on a touch and/or grip area of an electronic device, and deformable material such as an EAP.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and/or other aspects, features, and advantages of certain embodiments of the present disclosure will be more apparent from the following description taken in conjunction with the accompanying drawings, in which:

FIGS. 3A to 3C are views to illustrate a method for detecting a touch in the first layer according to an embodiment of the present disclosure;

FIGS. 4A to 4C are views to illustrate a method for detecting a touch in the first layer in response to the first layer being a capacitive touch sensor according to an embodiment of the present disclosure;

Throughout the drawings, it should be noted that like reference numbers are used to depict the same or similar elements, features, and structures.

DETAILED DESCRIPTION

Figure 1:
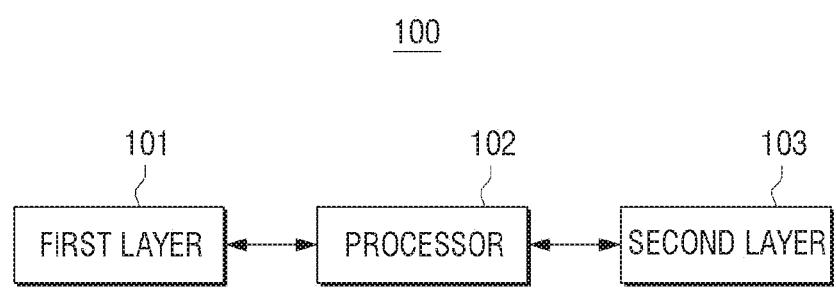
FIG. 1 is a block diagram schematically showing a configuration of an electronic device according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modification, of various embodiments described herein can be made without departing from the scope and spirit of the present disclosure. In addition, descriptions of well-known functions or constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The terms such as "first" and "second" used in various embodiments may be used to explain various elements, and does not limit the corresponding elements. These terms may be used for the purpose of distinguishing one element from another element.

In addition, the term "comprise" or "include" used in various embodiments of the present disclosure is to indicate the presence of features, numbers, operations, elements, parts, or a combination thereof described in the specifications, and do not preclude the presence or addition of one or more other features, numbers, operations, elements, parts, or a combination thereof.

In addition, "module" or "unit" used in various embodiments perform at least one function or operation and may be implemented by using hardware or software or a combination of hardware and software. In addition, a plurality of "modules" or a plurality of "units" may be integrated into at least one module and implemented by using at least one processor (not shown), except for "modules" or "units" which need to be implemented by using specific hardware.

The term "user" used in various embodiments may refer to a person who uses the electronic device or a device that uses the electronic device (for example, an artificial intelligence electronic device).

In addition, the term "touch input" or "touch" in the various embodiments refers to a touch gesture which is performed by a user on a display and a cover/surface of the electronic device. In addition, the "touch input" or "touch" may include a touch which is not in contact with the display and the cover/surface and is separated from the display and the cover/surface by more than a predetermined distance (for example, floating or hovering). The "touch input" or "touch" may include a gesture of touching the electronic device to hold or grip the electronic device.

The touch input may include a touch and hold gesture, a tap gesture which touches and then removes the touch, a double tap gesture, a panning gesture, a flick gesture, and a touch and drag gesture which touches and then moves in one direction while still touching, a pinch gesture, and the like, but is not limited to these.

Hereinafter, various embodiments of the present disclosure will be explained in detail with reference to the accompanying drawings, so that a person skilled in the art can easily embody the present disclosure. However, the present disclosure can be implemented in various different forms and is not limited to the various embodiments described herein. In addition, portions having nothing to do with the explanations are omitted from the drawings to clearly explain the present disclosure, and similar reference numerals are used for similar parts throughout the specification.

FIG. 1 is a block diagram schematically showing a configuration of an electronic device according to an embodiment of the present disclosure.

Referring to FIG. 1, the electronic device 100 may include a first layer 101, a processor 102, and a second layer 103.

According to an embodiment, the electronic device 100 may include all kinds of devices which can be touched or gripped by users. For example, the electronic device 100 may include various electronic devices such as a mobile device, a personal digital assistant (PDA), a laptop computer, a keyboard, a mouse, a joystick, a car brake, a car steering wheel, a remote controller, a digital camera, a wearable device, etc. The above-described examples are merely various embodiments and are not limited to these.

The first layer 101 is configured on the surface of the electronic device 100 to be gripped by a user. The first layer 101 may generate a signal corresponding to a touch and/or grip area of the user. In this case, the first layer 101 may include various sensors to detect user's touch and motion. For example, the first layer 101 may include various sensors such as an optics sensor, a velocity sensor, a gyroscope sensor, an acceleration sensor, a thermal sensor, a humidity sensor, etc. The above-described examples are merely various embodiments and are not limited to these.

The second layer 103 is disposed on the first layer 101 in contact therewith, and may receive a touch signal generated in the first layer 101 and have its surface shape deformed on the touch and/or grip area. In this case, the second layer 103 may be an electric element which has flexibility and elasticity and has a deformable shape. For example, the second layer 103 may include various elements such as an electroactive polymer (EAP), a piezoelectric element, a micro electro mechanical systems (MEMS) element, a silicon rubber, etc. The above-described examples are merely various embodiments, and are not limited to these.

The processor 102 detects the user's touch and/or grip area on the surface of the electronic device 100 based on the touch signal generated in the first layer 101. The processor 102 may control the second layer 103 to change to a surface having a protrusion pattern on the touch and/or grip area of the second layer 103 based on the touch signal generated in the first layer 101.

The processor 102 may control the second layer 103 to change to a surface having a first protrusion pattern using at least one of a bump, a dot, and a line for increasing a handling friction coefficient of the user within the touch and/or grip area of the second layer 103.

In addition, the processor 102 may control the second layer 103 to change to a surface having a second protrusion pattern using at least one of a bump, a dot, and a line for increasing handling stability of the user on an area surrounding the touch and/or grip area of the second layer 103. The processor 102 may control the second layer 103 such that the second protrusion pattern is a different height than the first protrusion pattern.

In this case, the protrusion pattern may be expressed in various ways, for example, using a picture, a text, a line, a dot, etc. The processor 120 may control the second layer 103 to show the protrusion pattern on the second layer 103 in a predetermined shape or in various shapes having different heights, widths, lengths, configurations, layouts, textures, patterns, and 3-dimensional (3D) forms according to a user's setting.

In addition, the processor 120 may control the second layer 103 to produce the protrusion pattern on the entire area of the second layer 103 or on a specific area such as the touch and/or grip area. For example, the first protrusion pattern may appear on the entire surface of the electronic device 100 or on the touch and grip area of the user in response to the user gripping the electronic device 100. In this case, the second protrusion pattern may be implemented to appear on the periphery of the area of the electronic device 100 griped by the user (for example, along a palm line or finger line). In addition, a predetermined protrusion pattern may be stored in a memory when the electronic device 100 is manufactured, or may be implemented through a user interface (UI) to be deformed by the user. The above-described examples are merely various embodiments, and are not limited to theses.

In addition, the electronic device 100 may further include a memory (not shown).

The memory may store various programs and data necessary for the operation of the electronic device 100. The processor 102 may control the overall operation of the electronic device 100 using the various programs stored in the memory. The memory may be accessed by the processor 102, and the processor 102 may read/record/correct/delete/update data with respect to the memory 102. The memory in this disclosure may include a memory, a read only memory (ROM) or a random access memory (RAM) in the processor 102, or a memory card (for example, a micro secure digital (SD) card, a memory stick) mounted in the electronic device 100.

In addition, the memory may store a matrix value corresponding to a touch area of the first layer 101 and protrusion pattern data of the second layer corresponding to the matrix value. The memory may store the protrusion pattern data of the second layer corresponding to a predetermined humidity or temperature. The memory may also store the protrusion pattern data of the second layer corresponding to various forces such as acceleration, rotary force, inertial force, tensiometer, etc.

According to an embodiment, the electronic device 100 may implement an ergonomic surface of the electronic device 100 by providing an optimized grip to the user due to the protrusion pattern formed on the second layer 103 on the touch and/or grip area.

Figure 2:
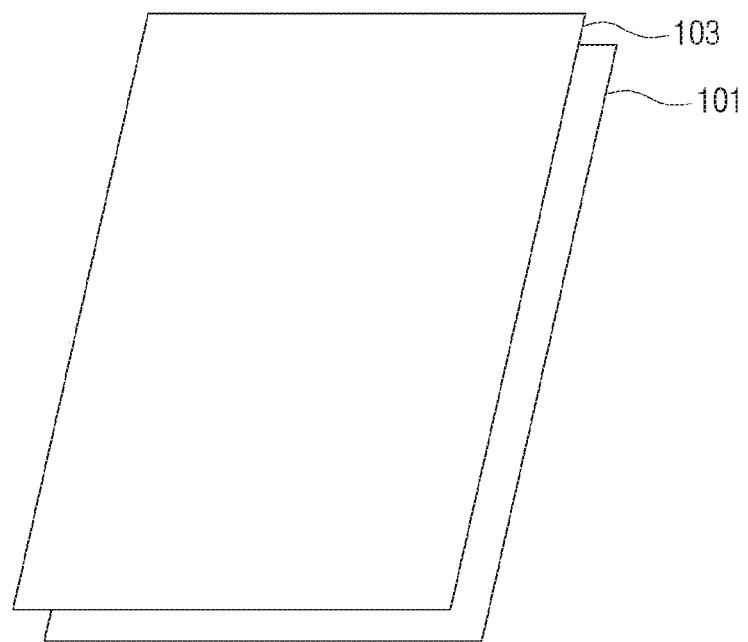
FIG. 2 is a view showing a first layer and a second layer forming the surface of the electronic device according to an embodiment of the present disclosure.

FIG. 2 is a view showing the first layer 101 and the second layer forming the surface of the electronic device according to an embodiment of the present disclosure.

Referring to FIG. 2, the first layer 101 is disposed under the second layer 103 in contact therewith. The second layer 103 may receive a touch signal generated in the first layer 101 and output a protrusion pattern which is formed by deforming the surface of the second layer 103 on the touch area corresponding to the inputted signal.

According to an embodiment, the first layer 101 may be formed of a capacitive sensor to detect a user's touch and/or grip area. In response to user's skin approaching or being in contact with the electronic device 100, the capacitive sensor may receive body's capacitance and generate energy using capacitive coupling. Accordingly, the electronic device 100 does not require an additional power supplier to operate the touch or grip sensor and thus has the effect of simplifying manufacturing.

According to an embodiment, the second layer 103 may be formed of an EAP. The EAP has the feature that a chemical bonding structure in the polymer can change due to an electric field and thus its size or shape changes in response. In addition, since the EAP has elasticity and strength similar to those of human tissue, unlike metal, ceramic, etc., the EAP may change shape freely.

The EAP generates electric energy in response to a shock and deformation being applied by external force. In addition, the EAP may have electrodes formed on both surfaces of the polymer and generates force as the polymer is compressed by electrostatic force in response to a voltage being applied to the electrodes. In this case, the EAP may be implemented by using a capacitive sensor which changes capacitance according to a change in a distance between the electrodes or an effective area between the electrodes.

According to an embodiment, in response to pressure force being inputted to the first layer 101 by a touch and/or a grip, the second layer 103 may have the size or shape of the polymer deformed by the pressure force inputted from the first layer 101.

According to another embodiment, the first layer 101 and the second layer 103 may further include a sensing module (not shown). The sensing module may detect various user interactions. The sensing module may detect at least one of various changes such as a change in a posture of the electronic device 100, a change in illuminance, a change in acceleration, etc., and may forward a corresponding electric signal to the processor 102.

That is, the sensing module may detect a change in the state which is made based on the electronic device 100, and generate a corresponding sensing signal and forward the sensing signal to the processor 102. The sensing module in this disclosure may be formed of various sensors, and power may be supplied to at least one set sensor under the control of the sensing module when the electronic device 100 is driven (or based on user setting), and the sensor may detect the change in the state of the electronic device 100.

For example, the sensing module may include at least one of various sensing electronic devices such as a touch sensor, an acceleration sensor, a gyro sensor, an illuminance sensor, a proximity sensor, a pressure sensor, an optics sensor, a video sensor (for example, a camera module), a pen detection sensor, a thermal sensor, a humidity detection sensor, and a timer.

The humidity detection sensor may forward humidity information generated between the electronic device 100 and a human body contact surface of the user contacting the electronic device 100 to the processor 102. For example, the processor 102 may control the second layer 103 to form the protrusion pattern of the second layer 103 in response to a humidity value detected by the humidity detection sensor falling out of a range of a predetermined value.

For example, the humidity of the surface of the electronic device 100 may increase due to sweat generated on the user's hand while the user is gripping the electronic device 100. In this case, in response to the humidity detected by the humidity detection sensor being greater than or equal to a predetermined humidity value stored in the memory, the electronic device 100 may be implemented to form the predetermined protrusion pattern (a protrusion pattern having predetermined height, width, and shape) on the surface of the second layer 103. In this case, the predetermined humidity value and the predetermined protrusion pattern may be stored in the memory when the electronic device 100 is manufactured. In addition, the electronic device 100 may automatically store a nonslip humidity threshold value in the electronic device 100 based on user's biometric data. In addition, the electronic device 100 may be implemented to allow the user to store a nonslip humidity threshold value through a user interface (UI).

Through this, the electronic device 100 can prevent the electronic device 100 from slipping out of the user's hand due to the humidity greater than or equal to the predetermined value, which is generated between the electronic device 100 and the user's hand.

The thermal sensor may forward temperature information generated between the electronic device 100 and a human body contact surface of the user contacting the electronic device 100 to the processor 102. For example, the processor 102 may control the second layer 103 to form a predetermined protrusion pattern of the second layer 103 in response to a temperature value detected by the thermal sensor falling out of a range of a predetermined value.

For example, in response to the electronic device 100 being a smart phone and the user playing a video for more than a predetermined time while gripping the smart phone, the temperature of the surface of the smart phone increases. In this case, in response to the temperature detected by the thermal sensor being greater than or equal to a predetermined temperature stored in the memory, the electronic device 100 may be implemented to form a predetermined protrusion pattern (a protrusion pattern having specific height, width, shape, etc.) on the surface of the second layer 103.

In this case, the predetermined temperature value and the predetermined protrusion pattern may be stored in the memory when the electronic device 100 is manufactured. In addition, the electronic device 100 may automatically store a temperature threshold value in the electronic device 100 based on user's biometric data. In addition, the electronic device 100 may be implemented to allow the user to store an optimized temperature threshold value through a UI. Through this, the electronic device 100 may provide information for allowing the user to detect an optimum surface temperature of the electronic device 100.

According to another embodiment, the first layer 101 and the second layer 103 may be combined with an image sensor. The image sensor may be implemented by using a charge-coupled device (CCD) image sensor or a complementary metal oxide semiconductor (CMOS) image sensor.

For example, in response to the electronic device 100 including an image sensor, the second layer 103 may receive a signal regarding a camera operation, which is detected by the image sensor, and form a predetermined protrusion pattern or a protrusion pattern which is set by the user on the surface of the second layer 103. Through this, the electronic device 100 provide an optimum grip to the user while the user is photographing using the electronic device 100, thereby preventing the electronic device 100 from slipping out of the user's grip.

According to another embodiment, the first layer 101 and the second layer 103 may be combined with a display (not shown). In this case, the protrusion pattern of the second layer may be selected and manipulated by the user on the display through a UI. In addition, various UIs may be implemented through the display.

FIGS. 3A to 4C are views to illustrate a method for detecting a touch in the first layer 101 and a method for forming a protrusion pattern in the second layer 103 in response to the first layer 101 including a capacitive touch sensor according to various embodiments of the present disclosure t.

Referring to FIGS. 3A to 3C, the first layer 101 may include a touch sensing panel 310, and the touch sensing panel 310 may detect an input by user's finger and palm and output a touch event value corresponding to the detected touch signal to a matrix 320.

In response to the user gripping or touching the first layer 101, the electronic device 100 may be implemented to change the second layer 103 to a surface having a protrusion pattern corresponding to a touch matrix value generated in the first layer 101.

The touch sensing panel 310 may detect the input by the user's finger and palm in a capacitive method or a resistive method, for example. The capacitive method is a method which calculates touch coordinates by detecting micro electricity excited by the user's body. The resistive method is a method which provides two electrode plates embedded in the touch panel, and calculates touch coordinates by detecting an electric current flowing because the upper and lower plates in contact with each other at a touch point. In this disclosure, the capacitive method will be explained for convenience of understanding.

The touch sensing panel 310 may acquire an output signal accompanied by the user input from a touch sensor. The touch sensing panel 310 may calculate user input information such as a touch location, touch coordinates, the number of touches, touch intensity, a cell identifier (ID), a touch angle, or a touch area (including a grip area) based on signal values, and determine a type of touch input using the calculated user input information.

For example, in response to a touch by user's finger being inputted to the touch sensing panel 310, the touch sensing panel 310 may designate the matrix value 320 as "1" at coordinates of a touch point 340 at which the first layer 101 is touched by the finger. The matrix value 320 may be designated as "0" at coordinates at which the finger is far from the first layer 101 by more than a predetermined distance 350. At coordinates at which a distance between the finger surface and the first layer 101 is within a predetermined distance 330, the matrix value 320 may be implemented such that the matrix value is closer to "0" as the finger surface is farther away from the touch sensing panel 310.

In this case, in response to a matrix value corresponding to a touch detected by the touch sensing panel 310 being "0", the electronic device 100 may be implemented to show the surface 350 on which a protrusion pattern is not formed on the second layer 103. In response to a matrix value (V) corresponding to a touch detected by the touch sensing panel 310 being greater than 0 and less than a threshold, for example, 0.5 (0<V<0.5), the electronic device 100 may be implemented to show a protrusion pattern having bumps of height of up to 4 mm on the surface of the second layer 103. In response to a matrix value (V) corresponding to a touch detected by the touch sensing panel 310 being greater than/or equal to the threshold (0.5) and less than/or equal to 1 inclusive (0.5≤V≤1.0), the electronic device 100 may be implemented to show a protrusion pattern having height of less than 2 mm on the surface of the second layer 103. The above-described examples are merely various embodiments to explain the present disclosure, and the matrix value corresponding to the touch area may be implemented in various ways.

FIGS. 4A to 4C illustrate examples of matrix values corresponding to a touch as described above with reference to FIGS. 3A to 3C.

According to an embodiment, the electronic device 100 may generate a touch matrix which has different values according to a gravity force of the first layer 101 from the user's skin in response to a touch input signal on a user's grip, touch and hovering area of the first layer 101.

In addition, in response to the user gripping or touching the first layer 101, the electronic device 100 may be implemented to change the second layer 103 to a surface having a protrusion pattern corresponding to the generated touch matrix value.

For example, in response to a distance between the user's body and the first layer 101 being greater than or equal to a predetermined distance, the first layer 101 may detect that a touch is not inputted to the first layer 101. In this case, a touch area 410 of the first layer 101 and the second layer 103 may be implemented such that a touch input matrix value 410-1 has "0."

The touch sensing panel 310 described in FIGS. 3A to 3C may determine a type of touch input using a touch recognition algorithm and touch pattern data stored in the memory. In response to the type of touch input being determined, the touch sensing panel 310 may transmit information on the type of touch input to the processor 102. The touch sensing panel 310 may detect a location of a proximity touch (or a location of hovering) which is inputted by the user.

In this case, the processor 102 may perform some of the functions of the touch sensing panel 310 on behalf of the touch sensing panel 310. For example, the touch sensing panel 310 may transmit a signal value which is acquired from the touch sensor or user input information which is calculated based on the signal value to the processor 102. The processor 102 may determine the type of touch input based on the received signal value or user input information using the touch recognition algorithm and the touch pattern data stored in the memory.

According to an embodiment, in response to the user performing hovering over the first layer 101, the electronic device 100 may be implemented to predict a predetermined protrusion pattern corresponding to a generated touch matrix value, and change the surface of the second layer 103 to a surface having a designated protrusion pattern.

For example, in response to a distance between the user's body and the first layer 101 being within a predetermined distance and the user's body not being in contact with the first layer 101, the first layer 101 may detect a proximity touch area 420 (or a hovering area) which is inputted by the user. In this case, a matrix value 420-1 of the inputted proximity touch may have different values to correspond to a distance of the finger surface to the proximity touch area 420. For example, the electronic device 100 may be implemented to designate a matrix value corresponding to the closest distance of the finger surface to the proximity touch area 420 as 0.8, a matrix value corresponding to a medium distance as 0.5, and a matrix value corresponding the farthest distance as 0.1.

In this case, the electronic device 100 may be implemented to change the surface of the second layer 103 to a designated protrusion pattern to correspond to the matrix value at a point which is the proximity touch area 410 where a touch input is predicted. For example, the protrusion pattern of the second layer 103 on the corresponding area 420 may have a micro protrusion size up to 2 mm, and may be implemented to be changed to a protrusion pattern having height of 1.6 mm at a point where the matrix value is 0.8, to a protrusion pattern having height of 1 mm at a point where the matrix value is 0.5, and to a protrusion pattern having height of 0.2 mm at a point where the matrix value is 0.1.

In addition, in response to the user's body being in contact with the first layer 101, the first layer 101 may detect a touch area 430 which is inputted by the user and a touch prediction area 440. In this case, a matrix value 430-1 of the inputted touch may have different values to correspond to a distance of the finger surface to the surface of the touch area 430. For example, the electronic device 100 may be implemented to designate a matrix value 430-1 corresponding to the finger surface being in contact with the touch area 430 as 1, and designates a matrix value 430-1 corresponding to the closest distance of the finger surface which is not in contact with the touch area 430 to the touch area 430 as from 0.9 to 0.8. In addition, the electronic device 100 may be implemented to designate a matrix value 430-1 corresponding to the farthest distance to the finger surface from the surface of the touch prediction area 440 as 0.1, and a matrix value 430-1 corresponding to a medium distance to the finger surface as 0.5.

In this case, the electronic device 100 may be implemented to change the surface of the second layer 103 on the touch area 430 to a designated protrusion pattern corresponding to the matrix value. For example, the protrusion pattern of the second layer 103 on the touch area 430 may have a micro protrusion size up to 1 mm, and may be implemented to be changed to a protrusion pattern having height of 1.0 mm at a point where the matrix value is 1, and to a protrusion pattern having height of 0.8 mm at a point where the matrix value is 0.8. In addition, the protrusion pattern on the touch prediction area 440 may have a protrusion size having height of up to 4 mm, and may be implemented to be changed to a protrusion pattern having height of 2.4 mm at a point where the matrix value is 0.6, and to a protrusion pattern having height of 0.4 mm at a point where the matrix value is 0.1.

However, the above-described matrix values and the heights of the protrusions corresponding to the matrix values are merely an embodiment to explain the present disclosure, and are not limited to the above-described numerical values and may be implemented in various ways.

Figure 5:
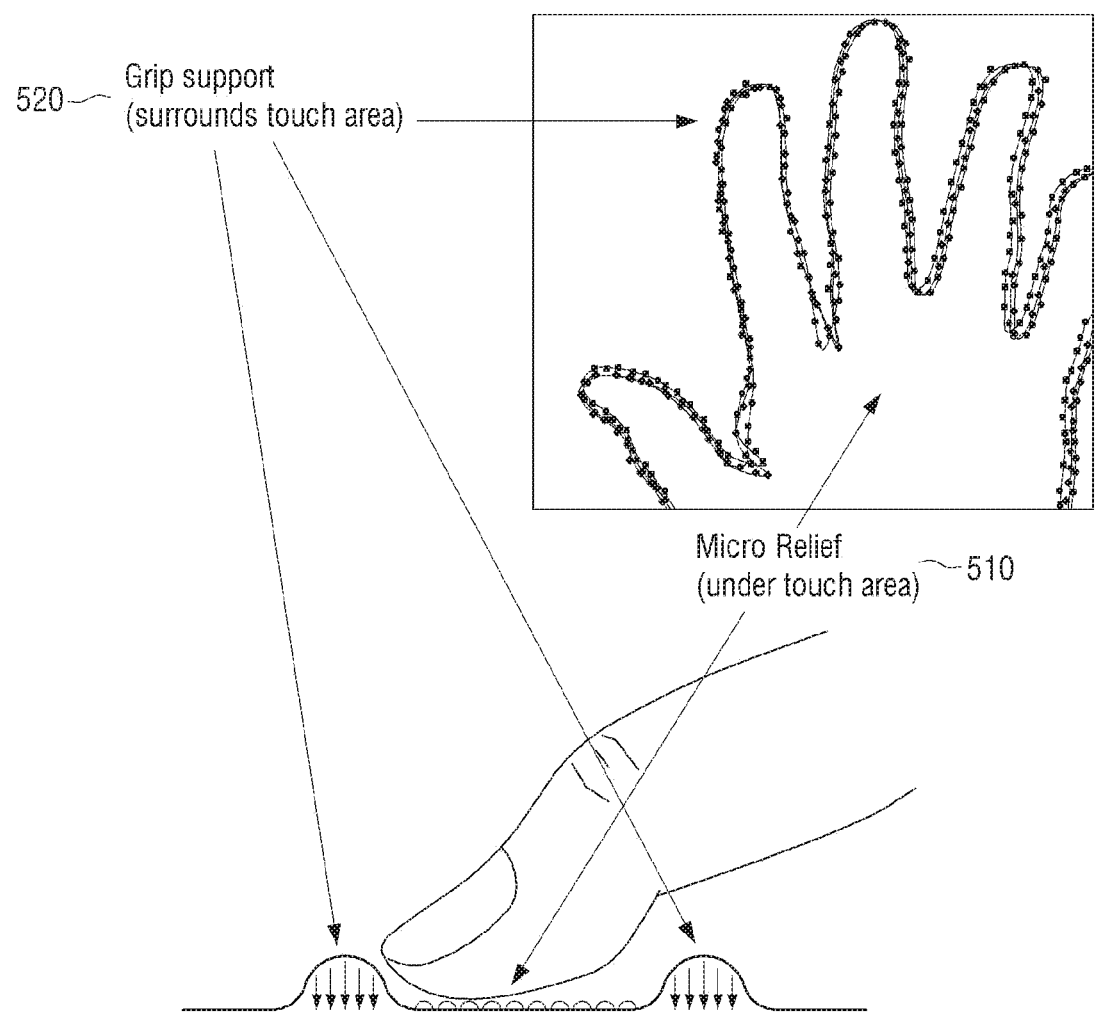
FIG. 5 is a view to illustrate a protrusion pattern which is generated on a touch area and a grip area surrounding the touch area according to an embodiment of the present disclosure.

FIG. 5 is a view to illustrate a protrusion pattern which is formed on a touch area and a grip area surrounding the touch area according to an embodiment of the present disclosure.

Referring to FIG. 5, the surface of the second layer 103 is changed to a protrusion pattern on a touch area 510 and a touch prediction area 520 as described above with reference to FIGS. 3A to 4C. In the present disclosure, the protrusion pattern changed from the surface of the second layer 103 on the above-described touch area 340 is defined as a micro relief 510, and the protrusion pattern changed from the surface of the second layer 103 on the periphery 330 of the touch area is defined as a grip support 520.

In this case, the micro relief 510 may be a first protrusion pattern which is formed of at least one of a bump, a dot, and a line for increasing a handling friction coefficient of the user, within or under the touch and/or grip area of the second layer 103.

The grip support 520 may be a second protrusion pattern which is formed of at least one of a bump, a dot, and a line for enhancing stability of handling of the user on an area surrounding the touch and/or grip area of the second layer 103.

According to an embodiment, the electronic device 100 may be implemented to change the second layer 103 to a surface having a protrusion pattern using at least one of the bump, the dot, and the line for increasing the handling friction coefficient of the user within the touch and/or grip area of the second layer 103.

For example, the micro relief 510 may be implemented to have micro height or designated mm height from the surface of the electronic device 100 which corresponds to a lower portion of an area which is in contact with user's finger or palm when the user touches or grips the electronic device 100 with user's finger or palm. In this case, in response to the surface of the user's body not being in contact with the surface of the electronic device 100, but a distance between the surface of the finger or palm and the surface of the electronic device 100 being within a designated distance, the surface of the second layer 103 may be changed to the micro relief 510. In this case, the protrusion pattern of the micro relief 510 may be implemented to be lower than the protrusion pattern of the grip support 520.

According to an embodiment, the electronic device 100 may be implemented to change the second layer 103 to a surface having a protrusion pattern using at least one of the bump, the dot, and the line for enhancing the stability of handling of the user on the area surrounding the touch and/or grip area of the second layer 103.

For example, the grip support 520 may be implemented to have designated height from the surface of the electronic device 100 which corresponds to the area surrounding the area which is in contact with user's finger or palm when the user touches or grips the electronic device 100 with user's finger or palm. The grip support 520 may be implemented to have a protrusion pattern which is higher than the protrusion pattern of the micro relief 510 on the surface of the second layer 103. According to an embodiment, in response to the second layer 103 being an EAP, the grip support 520 may be implemented to have a protrusion pattern of height of up to 4 mm. However, the maximum height of a protrusion pattern is merely an embodiment to explain the present disclosure, and the present disclosure is not limited thereto. The height of a protrusion pattern may be implemented in various ways according to the change in EAP techniques.

Accordingly, in response to the electronic device 100 being gripped by the user, the electronic device 100 provides an ergonomic surface to the user by deforming the surface into the plurality of small protrusion patterns in the form of the micro relief 510 on the area where the user's hand is in contact with the surface of the electronic device 100. In addition, the electronic device 100 provide an ergonomic surface to provide an optimum grip to the user by deforming the surface into the protrusion pattern in the form of the grip support 520 on the area (along the border of the hand) surrounding the area where user's hand is in contact with the surface of the electronic device 100. In this case, the electronic device 100 may be implemented to provide a haptic effect to the user with the protrusion pattern of the second layer 103 using a haptic sensor.

Figure 6A:
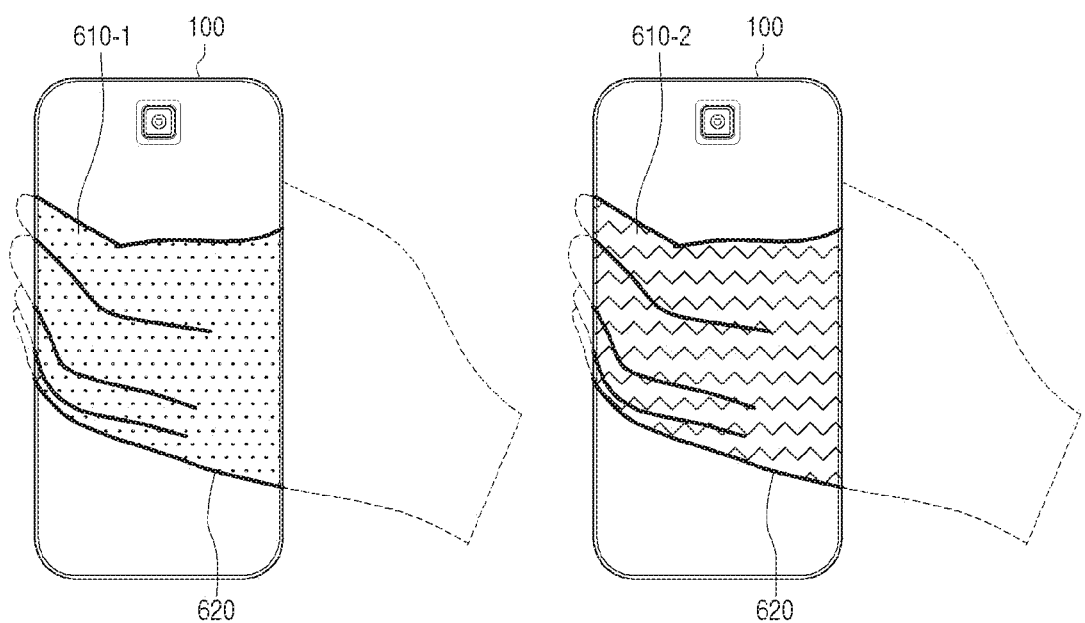
FIGS. 6A to 6C are views to illustrate a protrusion pattern type on a touch area and a grip area surrounding the touch area according to an embodiment of the present disclosure.
Figure 6B:
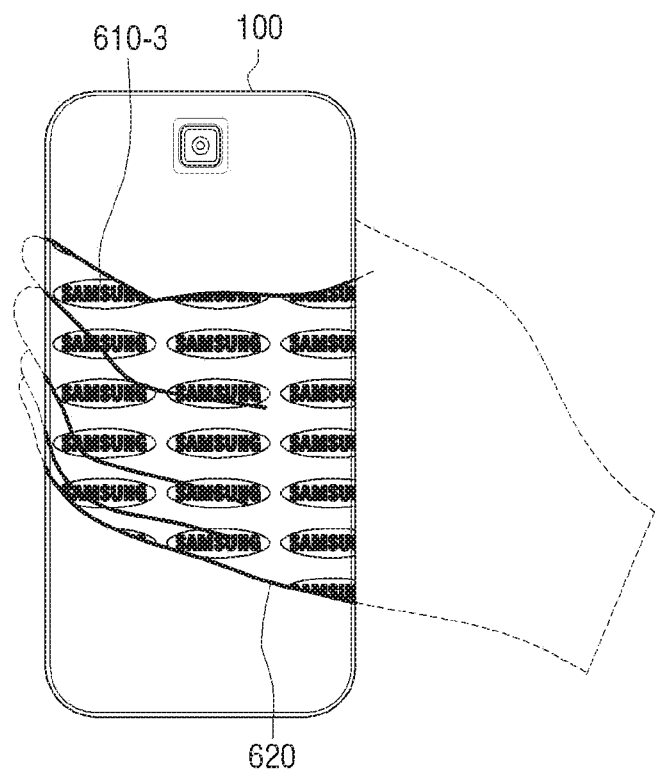
Figure 6C:
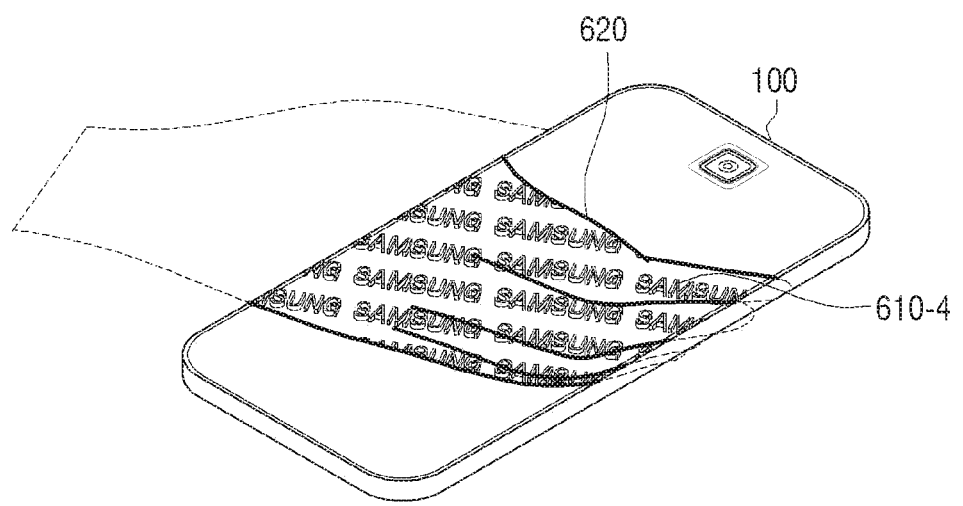

FIGS. 6A to 6C are views to illustrate a protrusion pattern type in a touch area and a grip area surrounding the touch area according to an embodiment of the present disclosure.

According to an embodiment, the protrusion pattern type may be implemented to change to a surface having a protrusion pattern on the entire area of the second layer 103 or within a touch and/or grip area.

Specifically, the electronic device 100 may be implemented to change to a surface having a protrusion pattern from a micro unit to millimeter (mm) using at least one of a bump, a dot, and line for increasing a handling friction coefficient of the user within the user's touch and/or grip area of the second layer 103. In this case, the protrusion pattern may use at least one of a character, a text, and a picture.

Referring to FIG. 6A, the protrusion pattern of the micro relief 510, 610-1, 610-2 on the touch area 610-1, 610-2 as described above with reference to FIG. 5 may be implemented to have a shape rising from the surface (above the surface) in the form of a dot 610-1, a line (not shown), or a zigzag line 610-2. In addition, the protrusion pattern of the grip support 520, 620 on the touch peripheral area 620 may be implemented to have a shape rising from the surface (above the surface) in the form of a bump higher than the micro relief 610-1, 610-2.

Referring to FIGS. 6B and 6C, the protrusion pattern of the micro relief 510, 610-3, 610-4 on the touch area 610-3, 610-4 may be implemented to have a shape rising from the surface (above the surface) in the form of an image 610-3 or a text 610-4. In addition, the protrusion pattern of the grip support 520, 620 on the touch peripheral area 620 may be implemented to have a shape rising from the surface (above the surface) in the form of a bump higher than the micro relief 610-3, 610-4.

The protrusion patterns described in FIGS. 6A to 6C are merely various embodiments to explain the present disclosure, and are not limited to these and may be implemented as protrusion patterns having various shapes, heights, forms, and 3D forms. In addition, the protrusion pattern of the micro relief 610-1, 610-2, 610-3, and 610-4 on the second layer 103 may be implemented to appear under the touch and grip area, and may be implemented to appear on the entire surface of the electronic device 100.

In addition, according to an embodiment, the electronic device 100 may be implemented to have the protrusion pattern of the micro relief 610-1, 610-2, 610-3, 610-4 on the second layer 103 changed according to a user setting. In addition, the electronic device 100 may be implemented to have the protrusion pattern implemented on a specific area according to user setting.

According to an embodiment, the electronic device 100 may be implemented to have the type of the protrusion pattern changed according to user setting. For example, the electronic device 100 may include a menu button in order for the user to manipulate the type of the protrusion pattern. In response to the electronic device 100 including a display, the electronic device 100 may be implemented to provide various UIs for selecting or manipulating the type of the protrusion pattern through the display.

In addition, in response to the electronic device 100 including a function of storing an image, the electronic device 100 may be implemented to allow the user to select an image stored in the electronic device 100 or a photographed image and apply the same as a protrusion pattern. The above-described examples are merely various embodiments to explain the present disclosure, and are not limited to these and a protrusion pattern which can be selected and changed by the user through various methods and techniques may be implemented.

Figure 7A:
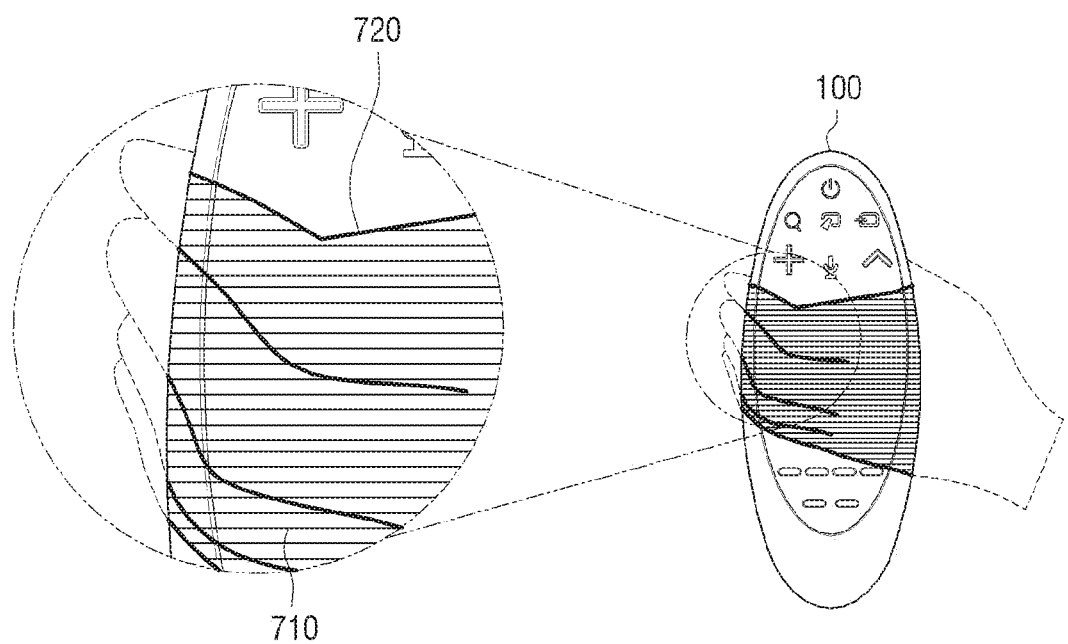
FIGS. 7A and 7B are views to illustrate a protrusion pattern on a touch area and a grip area according to gravity force according to an embodiment of the present disclosure.
Figure 7B:
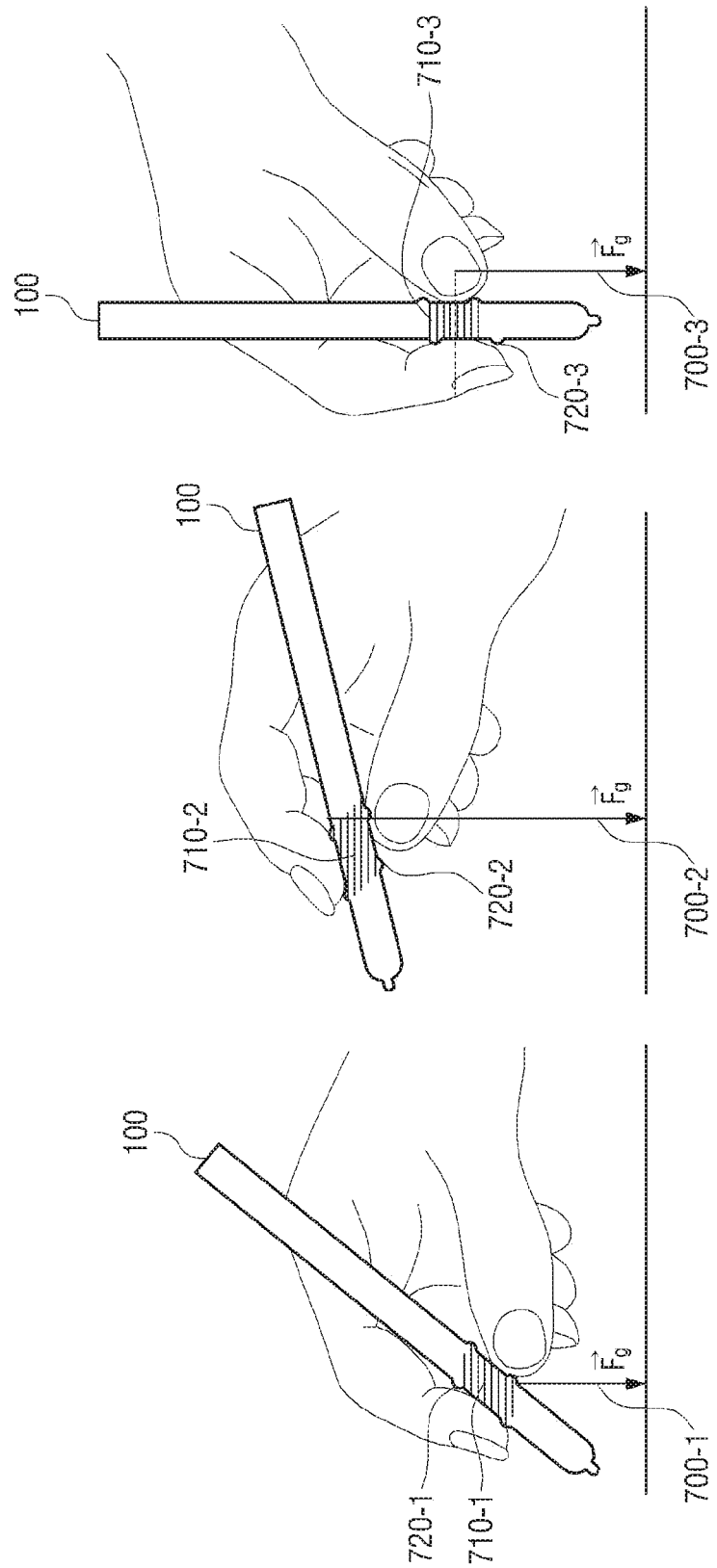

FIGS. 7A and 7B are views to illustrate a protrusion pattern on a touch area and a grip area according to gravity force of a device according to an embodiment of the present disclosure.

According to an embodiment, the electronic device 100 may be implemented to change the second layer 103 to a surface having a protrusion pattern having different height according to at least one of gravity force, acceleration force, and tensiometer on a touch and/or grip area of the second layer 103.

In addition, in response to the protrusion pattern which is deformed on the second layer 103 by user's touch and grip being a pattern having orientation, the protrusion pattern may be implemented to change to a surface having a protrusion pattern which is perpendicular to gravity on the touch and/or grip area of the second layer 103.

Specifically, in response to the electronic device 100 being held by the user and having its location changed like a remote control, a smart phone, a stylus pen, a car steering wheel, a car brake handle, a joystick, etc., the protrusion pattern formed on the surface of the electronic device 100 may be a pattern having orientation. In this disclosure, the protrusion pattern appearing within the touch and/or grip area of the electronic device 100 may have a pattern for increasing the handling friction coefficient of the user. Accordingly, the protrusion pattern may be implemented to be perpendicular to gravity in order to increase the handling friction coefficient of the user.

Referring to FIGS. 7A and 7B, in response to the electronic device 100 being held by the user and being moved horizontally and vertically, the protrusion pattern in the form of a micro relief 710, 710-1, 710-2, 710-3 within the touch area may be implemented to be perpendicular to gravity direction 700-1, 700-2, 700-3. That is, the protrusion pattern of the micro relief 710, 710-1, 710-2, 710-3 within the touch area of the electronic device may be implemented to be perpendicular to the ground. In this case, the protrusion pattern of the grip support 720, 720-1, 720-2, 720-3 on the touch peripheral area 720, 720-1, 720-2, 720-3 may be implemented to have a shape rising from the surface or above the surface in the form of a bump higher than the micro relief 710, 710-1, 710-2, 710-3.

Figure 8:
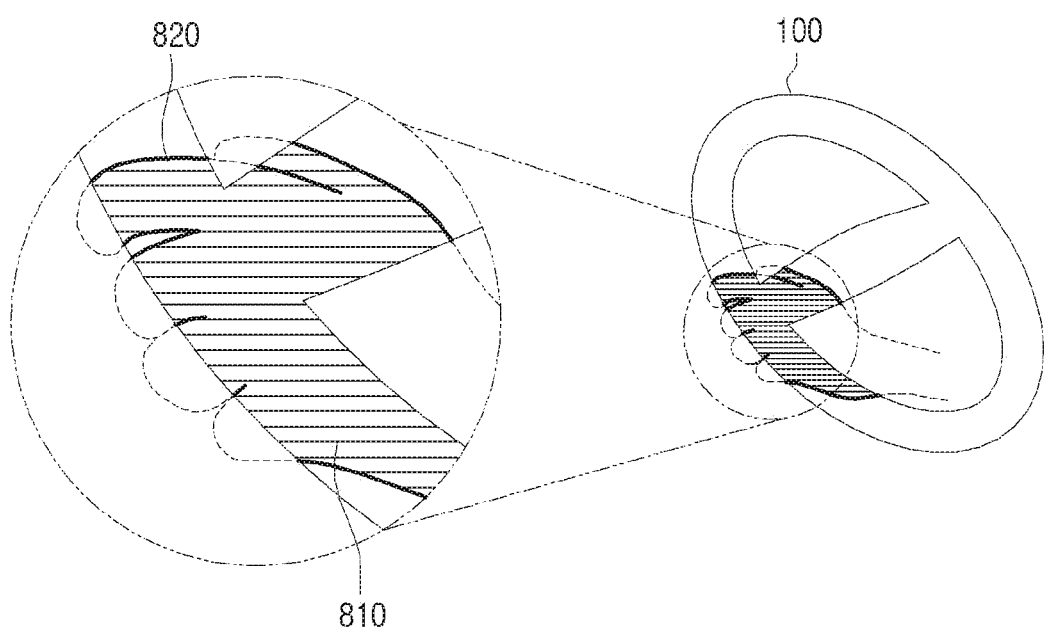
FIG. 8 is a view to illustrate a protrusion pattern on a touch area and a grip area surrounding the touch area according to an angular speed of a steering wheel according to an embodiment of the present disclosure.

FIG. 8 is a view to illustrate a protrusion pattern on a touch area and a grip area surrounding the touch area according to an angular speed of a steering wheel according to an embodiment of the present disclosure.

According to an embodiment, the electronic device 100 may detect a motion of the electronic device 100 (for example, rotation, tilting, etc.) using at least one of an acceleration sensor, a tilt sensor, a gyro sensor, and a 3-axis magnetic sensor. In addition, the sensing module described above in FIG. 2 may forward an electric signal generated in the above-described sensor to the processor 102. For example, the sensing module may measure acceleration added with motion acceleration and gravitational acceleration of the electronic device 100, but may measure only gravitational acceleration when there is no motion of the electronic device 100.

For example, on the assumption that the sensing module uses the acceleration sensor, gravitational acceleration for X, Y, and Z axes may be measured with reference to the electronic device 100.

Referring to FIG. 8, a rotation angle is generated as the car steering wheel 100 is rotated. In this case, the electronic device 100 may be implemented to form a protrusion pattern on the surface of the second layer 103 of the electronic device 100 in response to force, such as acceleration, gravity force, inertial force, rotary force, being detected by the acceleration sensor, the tilt sensor, the gyro sensor, etc.

In addition, as described in FIGS. 7A and 7B, in response to the protrusion pattern formed on the surface of the electronic device 100 being a pattern having orientation, the protrusion pattern 810 appearing within a touch and/or grip area 810 of the electronic device 100 may be implemented to be perpendicular to gravity to increase the handling friction coefficient of the user. Alternatively, the protrusion pattern 810 may be implemented with an orientation determined according to the detected motion, rotation, tilt, or acceleration.

In this case, a protrusion pattern of a grip support 820 on a touch peripheral area 820 may be implemented to have a shape rising from the surface or above the surface in the form of a bump higher than the micro relief 810.

Figure 9:
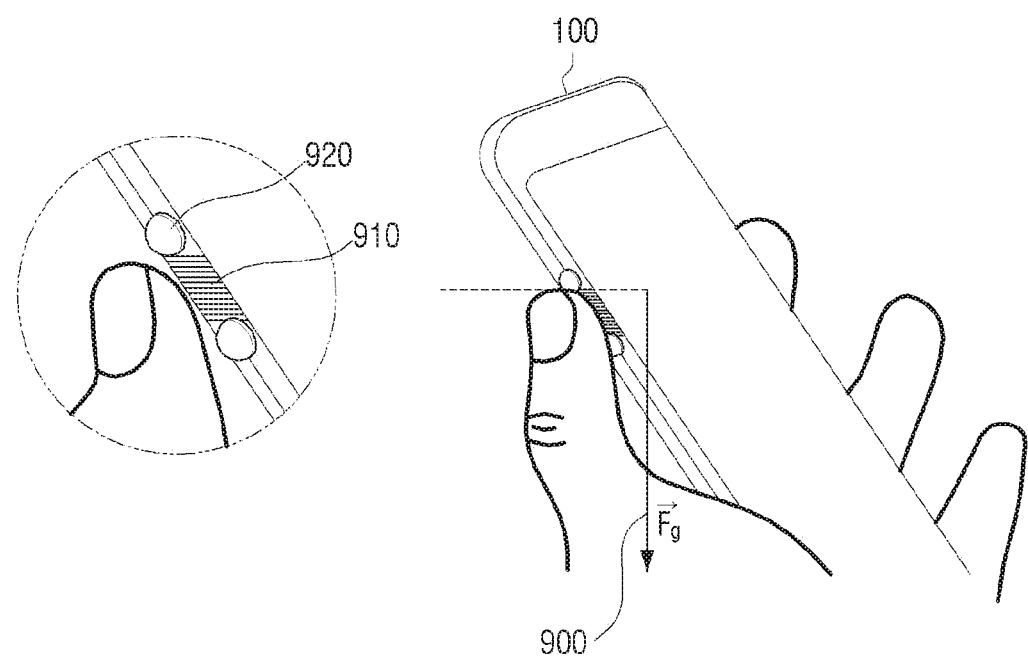
FIG. 9 is a view to illustrate a protrusion pattern on a touch area and a grip area surrounding the touch area according to rotation and an angular speed of a device according to an embodiment of the present disclosure.

FIG. 9 is a view to illustrate a protrusion pattern on a touch area and a grip area surrounding the touch area according to rotation and an angular speed of a device according to an embodiment of the present disclosure.

Referring to FIG. 9, in response to the user gripping the electronic device 100 with two of the user's fingers, a surface within a touch and/or grip area 910 of the electronic device 100 may be deformed into a protrusion pattern 910 of a micro relief, and a surface on the periphery 920 of the touch and/or grip area may be deformed into a protrusion pattern of a grip support 920. In this case, in response to the user gripping the electronic device 100 with two fingers without using the user's palm, the electronic device 100 may be rotated. In this case, the electronic device 100 may be implemented to form a protrusion pattern on the surface of the second layer 103 of the electronic device in response to a force, such as acceleration, gravity, rotary force, inertial force, etc., being detected by the acceleration sensor, the tilt sensor, the gyro sensor, etc.

In addition, as described above in FIG. 8, in response to the protrusion pattern formed on the surface of the electronic device 100 being a pattern having orientation, the protrusion pattern 910 appearing within the touch and/or grip area 910 of the electronic device 100 may be implemented to be perpendicular to the gravity direction 900 to increase the handling friction coefficient of the user. In this case, the protrusion pattern of the grip support 920 on the touch peripheral area 920 may be implemented to have a shape rising from the surface or above the surface in the form of a bump higher than the micro relief 910.

According to another embodiment, the second layer 103 of the electronic device 100 may be implemented by using an EAP which is an ionic polymer metal composite (IPMC) including moisture. In response to external pressure and force being applied to the surface of the electronic device 100 by a touch and/or a grip, surface tension may be generated on the second layer 103. The EAP has the feature of having its shape deformed by external force, and thus the electronic device 100 may be implemented to have a designated protrusion pattern on the surface of the second layer 103 by the surface tension generated at this time.

Figure 10A:
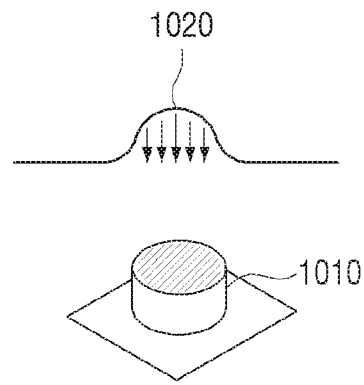
FIGS. 10A to 10C are views to illustrate a reaction of a protrusion pattern with time according to an embodiment of the present disclosure.
Figure 10B:
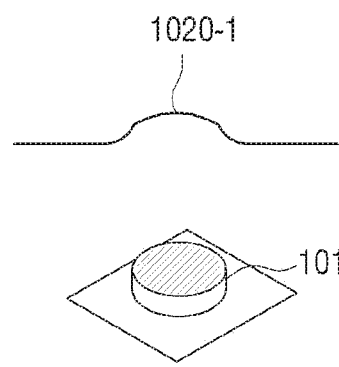
Figure 10C:
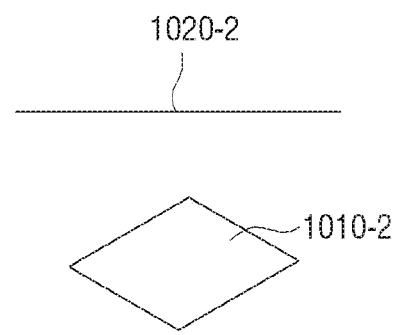

FIG. 10 is a view to illustrate a reaction of a protrusion pattern with time according to an embodiment of the present disclosure.

Referring to FIG. 10, as described in FIGS. 4A to 4C, the surface of the electronic device 100 may be implemented to be deformed into a protrusion pattern 1010 stored in the memory on an area where a touch and/or grip area 1020 is predicted. The protrusion pattern may be implemented to have a shape 1010, 1010-1 rising from the surface of the electronic device 100. In this case, in response to an input of a touch and/or grip not being received from the user on the touch and/or grip area within a designated time, the electronic device 100 may be implemented to reduce the height of the protrusion pattern protruding from the surface of the electronic device 100 (1020-1, 1010-1). In addition, in response to an input of a touch and/or grip not being received from the user on the touch and/or grip area for more than the designated time, the electronic device 100 may be implemented to make the protrusion pattern disappear (1020-2, 1010-2).

Figure 11:
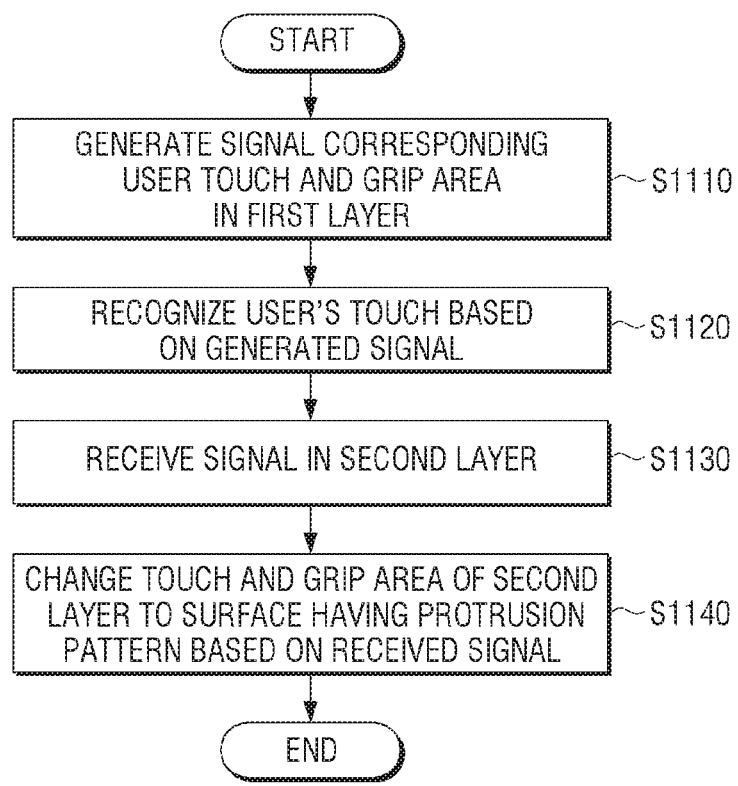
FIG. 11 is a flowchart to illustrate a method for forming a protrusion pattern on a surface of the electronic device according to an embodiment of the present disclosure.

FIG. 11 is a flowchart to illustrate a method for forming a protrusion pattern on the surface of the electronic device according to an embodiment of the present disclosure.

At operation S1110, the electronic device 100 generates a signal corresponding to a user touch and/or grip area in the first layer 101. The first layer 101 is configured on the surface of the electronic device 100 to be gripped by the user. In this case, the first layer 101 may include various sensors to detect user's touch and motion.

At operation S1120, the electronic device 100 may detect a user's touch and/or grip area on the surface of the electronic device 100 based on the touch signal generated in the first layer 101. The electronic device 100 may generate a touch matrix having different values according to gravity force of the first layer 101 from user's skin in response to a touch input signal on a user's grip, touch, and hovering area on the first layer 101.

In this case, the first layer 101 may include a touch sensing panel, and the touch sensing panel may detect an input of user's finger and palm and output a touch event value corresponding to the detected touch signal as a matrix.

At operation S1130, the electronic device 100 may be implemented such that the second layer 103 receives the touch signal generated in the first layer 101. The second layer 103 may be disposed on the first layer 101 in contact therewith and may receive the touch signal generated in the first layer 101 and have its surface shape deformed on the touch and/or grip area. In this case, the second layer 103 may include an electric element which has flexibility and elasticity and has a deformable shape. The second layer 103 may be implemented by using an EAP.

At operation S1140, the electronic device 100 may deform the touch and/or grip area of the second layer 103 to a surface having a protrusion pattern based on the received signal. The electronic device 100 may be implemented to deform the touch and/or grip area of the second layer 103 to the surface having the protrusion pattern based on the touch signal generated in the first layer 101.

In response to the user performing hovering in proximity to the first layer 101, the electronic device 100 may predict a protrusion pattern corresponding to the generated touch matrix value, and deform the surface of the second layer 103 to the surface having the designated protrusion pattern.

The electronic device 100 may be implemented to change the second layer 103 to a surface having a protrusion pattern using at least one of a bump, a dot, and a line for increasing a handling friction coefficient of the user within the touch and/or grip area of the second layer 103.

The electronic device 100 may be implemented to change the second layer 103 to a surface having a protrusion pattern using at least one of a bump, a dot, and a line for enhancing stability of handling of the user on an area surrounding the touch and/or grip area of the second layer 103.

The protrusion pattern type may be implemented to change to a surface having a protrusion pattern on the entire area of the second layer 103 or within the touch and/or grip area.

The electronic device 100 may be implemented to change to a surface having a protrusion pattern from a micro unit to millimeter using at least one of a bump, a dot, and line for increasing the handling friction coefficient of the user within the user's touch and/or grip area of the second layer 103. In this case, the protrusion pattern may use at least one of a character, a text, and a picture.

The electronic device 100 may be implemented to change the second layer 103 to a surface having a protrusion pattern of different height according to at least one of gravity force, acceleration, and tensiometer applied from the touch and/or grip area of the second layer 103 to the plane.

In addition, in response to the protrusion pattern deformed on the second layer 103 by user's touch and grip being a pattern having orientation, the electronic device 100 may be implemented to change the protrusion pattern to a surface having a protrusion pattern perpendicular to gravity on the touch and/or grip area of the second layer 103.

According to an embodiment, the processor 102 may include a RAM, a ROM, a graphic processor, a main central processing unit (CPU), first and nth interfaces, and a bus. In this case, the RAM, the ROM, the graphic processor, the main CPU, the first to nth interfaces may be connected with one another via the bus.

The RAM stores an operating system (OS) and an application program. Specifically, in response to the electronic device 100 being booted, the OS is stored in the RAM, and various application data selected by the user may be stored in the RAM.

The ROM may store a set of instructions for booting a system. In response to a turn on command being inputted and power being supplied, the main CPU may copy the OS stored in the memory into the RAM according to a command stored in the ROM, and boot the system by executing the OS. In response to the booting being completed, the main CPU may copy various application programs stored in the memory into the RAM 131, and perform various operations by executing the application programs copied into the RAM.

The main CPU may access the memory and perform booting using the OS stored in the memory. In addition, the main CPU may perform various operations using various programs, contents, and data which are stored in the memory.

The first to nth interfaces may be connected with the above-described various elements. One of the first to nth interfaces may be a network interface which is connected with an external device via a network.

The apparatus (for example, modules or electronic device 100) or method (for example, operations) according to various embodiments may be performed by at least one computer (for example, a processor 102) which executes instructions included in at least one program from among programs which are maintained in a computer-readable storage medium.

When the instructions are executed by a computer (for example, the processor 102), the at least one computer may perform a function corresponding to the instructions. In this case, the computer-readable storage medium may be the memory, for example.

The program may be included in a computer-readable storage medium such as a hard disk, a floppy disk, magnetic medium (for example, a magnetic tape), optical media (for example, a compact disc-ROM (CD-ROM), a digital versatile disc (DVD), a magneto-optical media (for example, a floptical disk)), a hardware device (for example, a ROM, RAM, or a flash memory), etc.

In this case, the storage medium may be included as a part of a configuration of the electronic device 100, but may be mounted through a port of the electronic device 100 or may be included in an external device (for example, a cloud, a server, or another electronic device) located outside the electronic device 100. In addition, the program may be stored in a plurality of storage media separately. In this case, at least part of the plurality of storage media may be located in an external device of the electronic device 100.

The instructions may include machine language codes created by a compiler, and high-level language codes that can be executed by a computer by using an interpreter. The above-described hardware device may be configured to operate as one or more software modules to perform the operations according to various embodiments, and vice versa.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
a first layer disposed on a surface of the electronic device and configured to be touched or gripped by a user and to generate a signal corresponding to a location of a touch or grip of the user;
a second layer disposed on the first layer and configured to have a surface shape of the second layer changed; and
a processor configured to:
identify the location of the touch or grip based on the generated signal, and
control the second layer to change a surface shape of the second layer at the location of the touch or grip.

2. The electronic device of claim 1, wherein the processor is further configured to control the second layer to change the surface shape of the second layer at the location of the touch or grip to have a first protrusion pattern comprising at least one of a bump, a dot, or a line, at least matching the touch or grip, for increasing a handling friction coefficient of the user at the location of the touch or grip.

3. The electronic device of claim 1, wherein the processor is further configured to control the second layer to change the surface shape of the second layer at the location of the touch or grip to have a second protrusion pattern comprising at least one of a bump, a dot, or a line, at a perimeter of the touch or grip, for enhancing stability of handling of the user on an area outlining the touch or grip.

4. The electronic device of claim 1, wherein, in response to a protrusion pattern of the surface shape having an orientation, the processor is further configured to control the second layer to change the protrusion pattern to a surface shape having a protrusion pattern which is perpendicular to gravity at the location of the touch or grip.

5. The electronic device of claim 4, wherein the processor is further configured to control the second layer to change the surface shape of the second layer at the location of the touch or grip to have a protrusion pattern of a different height according to at least one of gravity, acceleration, or a detected tension at the location of the touch or grip.

6. The electronic device of claim 1, wherein, in response to protrusion pattern of the surface shape having an orientation, the processor is further configured to control the second layer to change the protrusion pattern with the orientation determined according to at least one of a detected rotation, a detected tilt, or a detected motion of the electronic device.

7. The electronic device of claim 1, wherein the processor is further configured to:
control a type of a protrusion pattern of the surface shape to be variable according to a user setting, and
control the second layer to change the surface shape of the second layer to have the protrusion pattern on one of an entire area of the second layer or an area matching the touch or grip.

8. The electronic device of claim 1, wherein, in response to the first layer being a capacitive layer, the processor is further configured to generate a touch matrix having different values according to a gravity force of the first layer from the user's skin in response to the signal in the user's grip, touch, or hovering area of the first layer.

9. The electronic device of claim 8, wherein, in response to the user gripping or touching the first layer, the processor is further configured to control the second layer to change the surface shape of the second layer to have a protrusion pattern corresponding to the generated touch matrix.

10. The electronic device of claim 8, wherein, in response to the user performing hovering in proximity to the first layer, the processor is further configured to:
predict a protrusion pattern corresponding to the generated touch matrix, and
control the second layer to change the surface shape of the second layer to have the protrusion pattern.

11. The electronic device of claim 1, wherein a protrusion pattern of the surface shape comprises a protrusion pattern using at least one of a character, a text, or a picture.

12. The electronic device of claim 1, wherein the second layer is an electroactive polymer (EAP).

13. A method for changing a shape of a grip surface of an electronic device, the method comprising:
generating a signal corresponding to a location of a touch or grip in a first layer which is disposed on a surface of the electronic device and configured to be touched or gripped by a user;
receiving, by a second layer disposed on a surface of the first layer and configured to have a surface shape of the second layer changed, the signal;
identifying the touch or grip based on the generated signal; and
changing the second layer at the location of the touch or grip.

14. The method of claim 13, wherein the changing comprises deforming the second layer at the location of the touch or grip to a surface shape having a first protrusion pattern using at least one of a bump, a dot, or a line at least matching the touch or grip for increasing a handling friction coefficient of the user at the location of the touch or grip.

15. The method of claim 13, wherein the changing comprises deforming the second layer at the location of the touch or grip to a surface shape having a second protrusion pattern using at least one of a bump, a dot, or a line at a perimeter of the touch or grip for enhancing stability of handling of the user on an area outlining the touch or grip.

16. The method of claim 13, wherein the changing comprises, in response to a protrusion pattern of the surface shape having an orientation, deforming the protrusion pattern to a surface shape having a protrusion pattern which is perpendicular to gravity at the location of the touch or grip.

17. The method of claim 16, wherein the changing comprises changing the second layer at the location of the touch or grip to a surface shape having a protrusion pattern of a different height according to at least one of gravity, acceleration, or a detected tension at the location of the touch or grip.

18. The method of claim 13, further comprising, in response to a protrusion pattern of the surface shape having an orientation, controlling the second layer to change the protrusion pattern with the orientation determined according to at least one of a detected rotation, a detected tilt, or a detected motion of the electronic device.

19. The method of claim 13, wherein the changing comprises controlling a type of a protrusion pattern of the surface shape to be variable according to a user setting, and changing the surface shape of the second layer to the surface shape having the protrusion pattern on one of an entire area of the second layer or an area matching the touch or grip.

20. The method of claim 13, further comprising, in response to the first layer comprising a capacitive layer, generating a touch matrix having different values according to a gravity force of the first layer from the user's touch in response to the signal in the user's grip, touch, or hovering area of the first layer.

* * * * *